Aug. 30, 1960 T. HUDSPETH 2,951,207

PARAMETRIC AMPLIFIER

Filed May 14, 1959

INVENTOR,
THOMAS HUDSPETH

BY Robert G. Clay

ATTORNEY

United States Patent Office 2,951,207

Patented Aug. 30, 1960

2,951,207

PARAMETRIC AMPLIFIER

Thomas Hudspeth, Malibu, Calif., assignor to Hughes Aircraft Company, Culver City, Calif., a corporation of Delaware Filed May 14, 1959, Ser. No. 813,134

8 Claims. (Cl. 330—5)

The present invention relates to a microwave amplifier and, more particularly, to a low noise variable capacitance parametric amplifier.

Within recent years several types of low-noise microwave amplifiers have been proposed and a few experimental models have been built and successfully operated in the laboratory. While some of these models have been installed and operated with conventional systems in the field and the results have demonstrated their practicability, these amplifiers have still been experimental in nature, structurally complex and bulky, difficult to reproduce with the same characteristics in successive models and inherently troublesome in tuning for suitable operation. As examples of the referenced disadvantages, one type of microwave amplifier requires low temperatures for operation and therefore requires an elaborate cooling system, another type requires microwave cavities that are resonant at several different frequencies which are inherently difficult to fabricate and tune, and still another type requires tuned coaxial line systems with the inclusion of additional elements for isolating certain of the systems to prevent interaction therebetween and establishment of undesired power-absorbing modes.

It is, therefore, an object of the present invention to provide a new and improved parametric amplifier.

Another object of the invention is to provide a simple and compact parametric amplifier suitable for production techniques.

Still another object of the invention is to provide a parametric amplifier that is easily tuned with a minimum of effort.

A further object of the invention is to provide a stable and reliable parametric amplifier having a very low power requirement.

In brief, the parametric amplifier of the present invention comprises a flat rectangular box of conductive material with two conductors disposed therein parallel to the longitudinal center line and arranged to resonate in a transmission line mode at a signal frequency. This mode is coupled to two semiconductor diodes respectively connected between ends of the two conductors and the box. In accordance with the invention the two diodes are poled to provide push-pull operation and are biased in the reverse direction. A coaxial line is mounted between the two conductors for a portion of the length thereof with the outer conductor in electrical contact with such two conductors. The coaxial line is terminated in a coupling loop so that energy propagated through the line excites a second transmission line mode at a pump frequency and the capacitance of the two diodes is varied at the rate of such pump frequency. Under these circumstances a portion of the energy of pump frequency is translated to add to the energy at the signal frequency and is coupled out in such amplified form.

Other objects and advantages of the invention will be apparent from the following description when considered together with the accompanying drawing, in which.

Figure 1:
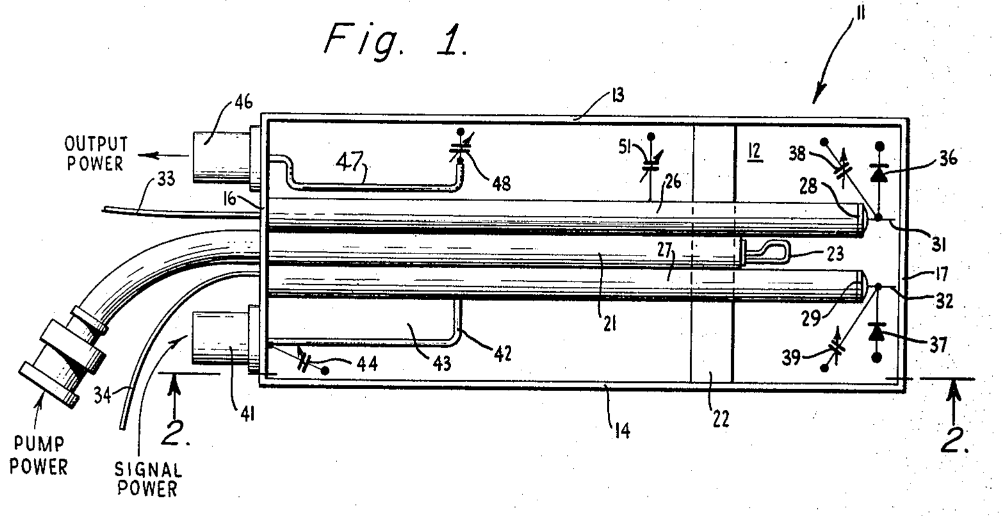
Fig. 1 is a plan view, partly in schematic form, of the present invention with the top removed.
Figure 2:
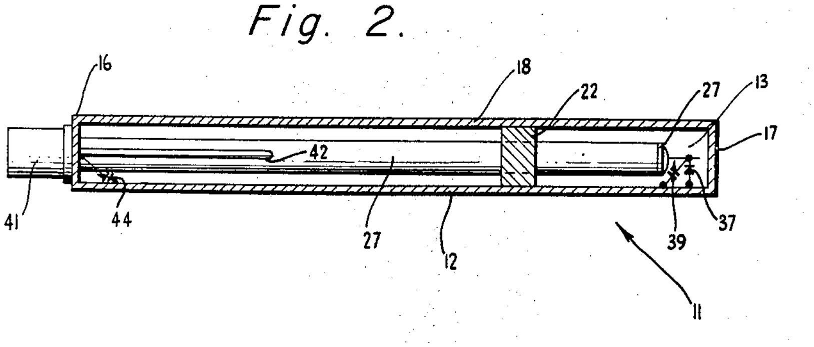
Fig. 2 is a sectional view of the invention of Fig. 1 taken along the line 2—2.

Referring to the drawing in detail, Fig. 1 in particular, there is shown a rectangular box 11 of conductive material, such as copper or brass, having a base plate 12, two elongated side plates 13 and 14, two narrow side plates 16 and 17, and a cover plate 18 (not shown in Fig. 1). A coaxial transmission line 21 is extended through a centrally positioned aperture in one narrow side plate 16 into the box 11 with the outer conductor in electrical contact with the side plate, as by conventional soldering techniques. The extended end of the coaxial line is terminated at and supported by a block of insulating material 22, such as polyfoam, disposed transversely with respect to the longitudinal dimension of the base plate 12. The length of the coaxial line 21 within the box 11 is substantially less than the length of the box and will be discussed further hereinafter. While the coaxial line 21 is terminated at the insulator 22, a conventional microwave coupling loop 23 is connected between the inner and outer conductors of the line and extended beyond the insulator.

Figure 3:
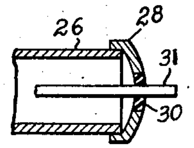
Fig. 3 is an enlarged cross section of one form of a feed-through capacitor of Fig. 1.

Also, within the box 11, there are provided two tubular conductors 26 and 27, parallel to the coaxial line 21 with one diametrically opposing the other, in electrical contact with the outer conductor and lying in a plane parallel to the base plate 12. The two conductors 26 and 27 have the same length and are electrically connected at one end to the narrow side plate 16 with the other ends supported by the insulator 22. The supported ends of the two conductors are not terminated at the insulator 22, but are extended a further distance just short of contact with the other narrow side plate 17. The extended ends of the two conductors 26 and 27 are provided with feed-through capacitors 28 and 29, respectively, with terminals 31 and 32 included at the center thereof. Each of the feed-through capacitors 28 and 29 include a dielectric material 30 between the terminals 31 and 32 and the connection to the conductors 26 and 27 to permit passage of radio frequency energy from the conductors to the terminals, but block passage of direct current bias energy from the terminals to the conductors. Such feed-through capacitors are conventional in the microwave art and one form thereof is illustrated in Fig. 3. An insulated wire 33 and 34, respectively, is mounted coaxially within each of the two conductors 26 and 27 with an insulated end projecting through suitable apertures in side plate 16 and connected, at the other end, to the feed-through capacitor terminals 31 and 32.

In accordance with the invention two semiconductor diodes 36 and 37 are respectively connected from the capacitor terminals 31 and 32 to the base plate 12. These two diodes 36 and 37 are poled in the opposite sense and this results in the anode of one being connected to the terminal 31 and the cathode of the other being connected to the terminal 32. Now, by applying a reverse bias to the two diodes 36 and 37 their nonlinear capacitive effect is available for amplification of the microwave energy. By reverse bias of a semiconductor diode is meant the application of a bias voltage establishing a region in the semiconductor material that is known as a depletion region wherein the electrons and charge carriers are in balance. Thus, by controlling the dimensions of such depletion region by applied voltage, the diode exhibits a voltage controlled nonlinear capacitance. Thus, as illustrated in Fig. 1, a direct current source (not shown) is connected to the two wires 33 and 34 to provide a negative voltage with respect to the base plate 12 to the wire 33 and a positive voltage to the wire 34. To manually alter the effective capacitance of the two diodes 36 and 37 coaxial type trimmer capacitors 38 and 39 are respectively connected in parallel with the diodes.

A conventional coaxial cable connector 41 is mounted on the narrow side plate 16 with a center conductor 42 extended through a suitable aperture in the side plate for connection to the tubular conductor 27 as an inductive input signal coupling loop 43. The degree of coupling by the loop 43 is controllable by a variable capacitor 44 connected from the conductor 42, at the point of emergence from the side plate 16, to the base plate 12. Similarly, a second coaxial connector 46 is mounted on the side plate 16 with a center conductor 47 extended through a suitable aperture into the box 11 parallel to the tubular conductor 26 and connected through a variable capacitor 48 to the base plate 12. This latter conductor 47 provides output coupling with the degree of coupling controlled by the variable capacitor 48. A final tuning adjustment is provided by a coaxial type trimmer capacitor 51 connected between the tubular conductor 26 and the base plate 12 for tuning the device to the signal frequency.

Figure 4:
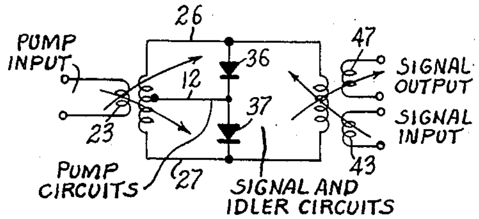
Fig. 4 is a simplified equivalent circuit of the invention of Fig. 1.

In operation, a source (not shown) of high frequency energy, for example, 804 megacycles per second, is connected to the coaxial line 21 and causes current to flow in the coupling loop 23. This energy of high frequency will be referred to as the pump power and is inductively coupled to the portion of the two conductors 26 and 27 extended beyond the termination of the coaxial line 21. It is to be noted that a short circuit exists for the pump power, as coupled to the two conductors 26 and 27 because of the electrical connection between the conductors and the outer conductor of the coaxial line 21. Two current paths are thus provided with one including the conductor 26, capacitance of the feed-through capacitor 28, the parallel combination of the diode 36 and capacitor 38, and the base plate 12, and with the other path including the conductor 27, capacitance of the feed-through capacitor 29, the parallel combination of the diode 37 and capacitor 39 and the base plate 12. Now, by suitable adjustment of the capacitance of the two trimmer capacitors 38 and 39 the respective circuits are made resonant at the pump frequency with the inductance of the conductors and capacitance of the capacitive elements properly related for such condition. It is to be noted that the magnetic field of the coupling loop 23 couples to the conductor 26 to induce a potential in one direction and to the conductor 27 to induce a potential in the opposite direction during one alternation of the pump current flowing through the coupling loop. Since the diodes 36 and 37 are poled oppositely in the respective circuits and reverse biased, the two circuits operate in push-pull with respect to the inductively coupled pump power and the capacitance of the two diodes is varied at the frequency of the pump power (see Fig. 4). Thus, during one alternation of the pump energy the potential appearing across the individual diodes 36 and 37 is in the same direction to vary the nonlinear capacitance thereof between substantially the same values. It is to be noted that the above-referenced short circuit prevents the appearance of the pump power at any portion of the amplifier structure, other than the two circuits described.

A signal to be amplified, at a lower frequency than that of the pump power, for example, 400 megacycles per second, is impressed at the connector 41 from any suitable source (not shown) and results in current flow through the input coupling loop 43. This current flow through the loop 43 then establishes a magnetic field that links the combination of the two conductors 26 and 27 and the outer conductor of the coaxial line 21 and thereby inductively couples energy of the signal to such combination. By suitable adjustment of the trimmer capacitor 51 the inductance and capacitance of the described combination are correlated for resonance at the frequency of the signal.

Thus, there are in effect two resonant circuits, one resonant at the frequency of the pump power and the other resonant at the frequency of the signal power, with both circuits being coupled by the capacitance of the diodes 36 and 37. The theory of parametric amplification has been set forth in the literature and reference is made to "Theory of Parametric Amplification Using Nonlinear Reactances" by S. Bloom and K. K. N. Chang in the RCA Review, Vol. 18, pp. 578–596, December 1957, for the theoretical treatment. With the aforementioned coupling between the two resonant circuits by the diodes 36 and 37, a portion of the pump power is translated to add to the signal power. During the modulation of the signal power at the frequency of the pump power, a difference or idler frequency is developed and energy at this idler frequency is supported by the same resonant circuit as the signal power. For the example given, where the pump power has a frequency of 804 megacycles per second and the signal power has a frequency of 400 megacycles per second, then the energy of the idler power has a frequency of 404 megacycles per second. Thus, since the frequencies of the signal and the idler are only 4 megacycles per second apart, the same resonant circuit supports both frequencies and discrimination at the output connector 46 is readily achieved by controlling the bandwidth of subsequent circuits. In some instances the signal and idler frequencies are equal, as where the pump frequency is twice that of the signal, but it is desirable to separate the two frequencies in order to avoid the idler frequency spectrum from interfering with the signal frequency spectrum.

The variable capacitor 44 at the input coupling loop 43 is adjusted for "tight" coupling between the loop and the two conductors 26 and 27 to maximize the noise output due to noise from the signal source and swamp-out noise due to other factors in the amplifier. On the other hand the variable capacitor 48 at output coupling loop 47 is adjusted for "loose" coupling by the loop to improve the noise figure of the amplifier by reducing noise coupled into the amplifier from the load.

As an example of an amplifier built in accordance with the above-described structure, the following specifications are listed:

Diodes 36, 37, HPA 2800 (2.5 micromicrofarads at 0 bias)
Trimmer capacitors 38, 39 (.8–5 micromicrofarads)

The results obtained with such structure were:

| | |
|---|---|
| Gain | 20 db. |
| Noise figure | 4.5 db. |
| Bandwidth | 3 mc. |
| Power drain | .6 mw. of 800 mc. power. |

There has, therefore, been set forth a parametric amplifier that is simple, rugged, and easily tuned. Further, the amplifier is easily reproduced by production methods to have the same characteristics in successive models. While the salient features of the parametric amplifier of the present invention have been described in detail with respect to a particular embodiment, it will be readily apparent that numerous modifications may be made within the spirit and scope of the invention, and it is, therefore, not desired to limit the invention to the exact details shown and described except insofar as they may be set forth in the following claims.

What is claimed is:

1. A microwave amplifier comprising an inductance-capacitance circuit resonant at a first frequency and respectively including in each of two separate branches a semiconductor diode having a nonlinear capacitive characteristic, each of said diodes being respectively poled in an opposite sense and biased in a reverse sense, means coupled to said diodes for varying the capacitance thereof in push-pull at the rate of a second frequency, said second frequency being greater than said first frequency, and means coupled to said circuit for obtaining an amplified output at said first frequency.

2. In a microwave amplifier, the combination comprising a first circuit resonant at a first frequency, a second circuit resonant at said first frequency coupled to said first circuit, said first and second circuits each including one of a pair of semiconductor diodes having nonlinear capacitive characteristics respectively poled in the opposite sense, a third circuit including said first and second circuits and resonant at a second frequency, means coupled to said first and second circuits to supply energy for varying the respective capacitance of each of said diodes at the rate of said first frequency in push-pull, means coupled to said third circuit for supplying a signal at said second frequency to be modulated at the rate of said first frequency by the nonlinear capacitance of said diodes, and means coupled to said third circuit to provide an amplified output at said second frequency.

3. In a microwave amplifier, the combination comprising a conductive housing, conductor means extended substantially along an axis of said housing for providing a coaxial system to propagate energy at a signal frequency, at least one semiconductor diode having a nonlinear capacitive characteristic coupled between the extended end of said conductor means and said housing, means connected to said conductor means for tuning the system to a resonant frequency equal to said signal frequency, means coupled to said diode for varying the capacitance thereof at a higher frequency of a pump power, and means coupled to said conductor means for coupling out of said housing an amplified signal at said signal frequency.

4. In a microwave amplifier, the combination comprising a conductive housing, conductor means extended substantially along an axis of said housing for providing a coaxial system having an inductive reactance to propagate energy at a signal frequency, at least one semiconductor diode having a nonlinear capacitive characteristic coupled between the extended end of said conductor means and said housing, a variable capacitor connected between said conductor means and said housing for manually tuning the system to a resonant frequency equal to said signal frequency, means coupled to said diode for varying the capacitance thereof at a higher frequency of a pump power, and means coupled to said conductor means for coupling out of said housing an amplified signal at said signal frequency.

5. In a microwave amplifier, the combination comprising a conductive housing, a first and second conductor extended in spaced-apart relation parallel to an axis and one wall of said housing for providing a coaxial system having an inductive reactance, said conductors being electrically connected to said housing at one end and electrically connected together at an intermediate point along the length thereof, first and second semiconductor diodes having a nonlinear capacitive characteristic respectively coupled between the extended ends of said first and second conductors and said housing, said diodes being oppositely poled, means coupled between said first and second conductors and said housing for applying energy at a signal frequency, a variable capacitor connected between said first and second conductors and said housing for manually tuning the system to a resonant frequency equal to said signal frequency, means disposed between extended ends of said first and second conductors for inductively coupling a pump power at a frequency higher than that of said signal, separate tuning means connected in parallel with each of said diodes to tune the extended end portions of said first and second conductors to a resonant frequency equal to the frequency of said pump power whereby the capacitance of said diodes is varioed in push-pull relation, and means coupled to said first and second conductors for coupling out of said housing an amplified signal at said signal frequency.

6. In a microwave amplifier, the combination comprising a conductive housing, a coaxial waveguide mounted axially within said housing and having a coupling loop termination, first and second tubular conductors mounted in contact with the outer conductor of said waveguide on either side thereof in a plane parallel to a base plate of said housing, said first and second conductors being extended in length beyond the termination of said waveguide, first and second semiconductor diodes having a nonlinear capacitive characteristic respectively coupled between the extended ends of said first and second conductors and said housing, separate variable capacitive tuning means connected in parallel with each of said diodes, variable capacitive tuning means connected between said first and second conductors and said base plate, means extended into said housing for coupling an input signal at a first frequency to said first and second conductors, means coupled to said coaxial waveguide for applying energy at a second higher frequency, and means coupled to said first and second conductors for providing an amplified output signal at said first frequency.

7. In a microwave amplifier the combination comprising a conductive housing, a coaxial waveguide mounted axially within said housing and having a coupling loop at the extended end, first and second tubular conductors extended parallel to and in electrical contact with the outer conductor of said coaxial waveguide in a plane parallel to a base plate of said housing, said first and second tubular conductors being extended in length beyond said coupling loop and providing a coaxial system having an inductive reactance, first and second semiconductor diodes having nonlinear capacitance characteristics respectively coupled to the extended ends said first and second conductors through capacitors and directly connected to said housing, said diodes being oppositely poled, separate means respectively extended coaxially through said conductors and connected to said diodes for applying a reverse bias, a variable capacitor connected between said first and second conductors and said housing for manually tuning said system to a resonant frequency equal to a signal frequency, separate variable capacitors respectively connected in parallel with said first and second diodes for manually tuning the extended portions of said first and second conductors to a pump power having a frequency substantially twice that of said signal, means coupled to said coaxial waveguide for applying said pump power whereby the nonlinear capacitance of said diodes is varied at a rate equal to the frequency of said pump power, input means coupled to said first and second conductors for applying a energy at said signal frequency, and output means coupled to said first and second conductors for coupling out an amplified signal at said signal frequency.

8. The combination of claim 7 wherein said input and output means are respectively characterized as inductive input and output coupling loops, each of said coupling loops including means for adjusting the degree of coupling to tight coupling at the input and loose coupling at the output to minimize the noise figure of the amplifier.

References Cited in the file of this patent

UNITED STATES PATENTS 2,719,223 Van Der Ziel et al. ______ Sept. 27, 1955

OTHER REFERENCES

Publication: Physical Review, vol. 106, No. 2, April 15, 1957, pages 384, 385.

Publication: Proceedings of the IRE, July 1956, pages 904–913.

Notice of Adverse Decision in Interference

In Interference No. 92,385 involving Patent No. 2,951,207, T. Hudspeth, Parametric amplifier, final judgment adverse to the patentee was rendered June 8, 1962, as to claims 3 and 4.

[*Official Gazette July 10, 1962.*]